United States Patent
Moriyama et al.

[11] Patent Number: 6,031,198
[45] Date of Patent: Feb. 29, 2000

[54] PLASMA PROCESSING METHOD AND APPARATUS

[75] Inventors: Koichiro Moriyama, Kyotanabe; Yukito Aota, Yokohama; Masahiro Kanai, Kyoto; Hirokazu Otoshi, Nara, all of Japan

[73] Assignee: Canon Kabushiki Kaisha, Tokyo, Japan

[21] Appl. No.: 09/080,922

[22] Filed: May 19, 1998

[30] Foreign Application Priority Data

May 22, 1997 [JP] Japan ................................. 9-132258
May 12, 1998 [JP] Japan ................................. 10-128897

[51] Int. Cl.$^7$ ................................................. B23K 9/00
[52] U.S. Cl. ................................. 219/121.57; 219/121.43
[58] Field of Search ...................... 219/121.57, 121.43; 204/298.38, 298.08; 438/62; 118/723 MW; 156/345; 422/186.29, 186.04

[56] References Cited

U.S. PATENT DOCUMENTS

| | | | |
|---|---|---|---|
| 4,824,546 | 4/1989 | Ohmi | 204/298.08 |
| 5,538,699 | 7/1996 | Suzuki | 422/186.29 |
| 5,567,241 | 10/1996 | Tsu et al. | 118/723 MW |
| 5,707,486 | 1/1998 | Collins | 156/345 |

*Primary Examiner*—Tu Ba Hoang
*Assistant Examiner*—Quang Van
*Attorney, Agent, or Firm*—Fitzpatrick, Cella, Harper & Scinto

[57] ABSTRACT

A plasma processing method for processing a substrate includes a discharge beginning step of supplying a second high-frequency power into a processing chamber through an impedance matching circuit and then supplying a first high-frequency power larger than a power used in processing into the processing chamber to generate a plasma. An adjustment step of reducing the first high-frequency power to be close to the value used in processing, increasing the second high-frequency power to be close to the value in processing, and then adjusting the first high-frequency power to obtain a plasma strength of a predetermined value is part of the method. The plasma processing step of causing the impedance matching circuit to perform a matching operation and simultaneously adjusting the first high-frequency power to obtain a plasma strength of a desired value in processing is also part of the method. Plasma discharge can be automatically, smoothly begun with high reproducibility, and stable plasma discharge can be maintained. Even in the case of disappearance of discharge, plasma discharge can be quickly restarted.

29 Claims, 6 Drawing Sheets

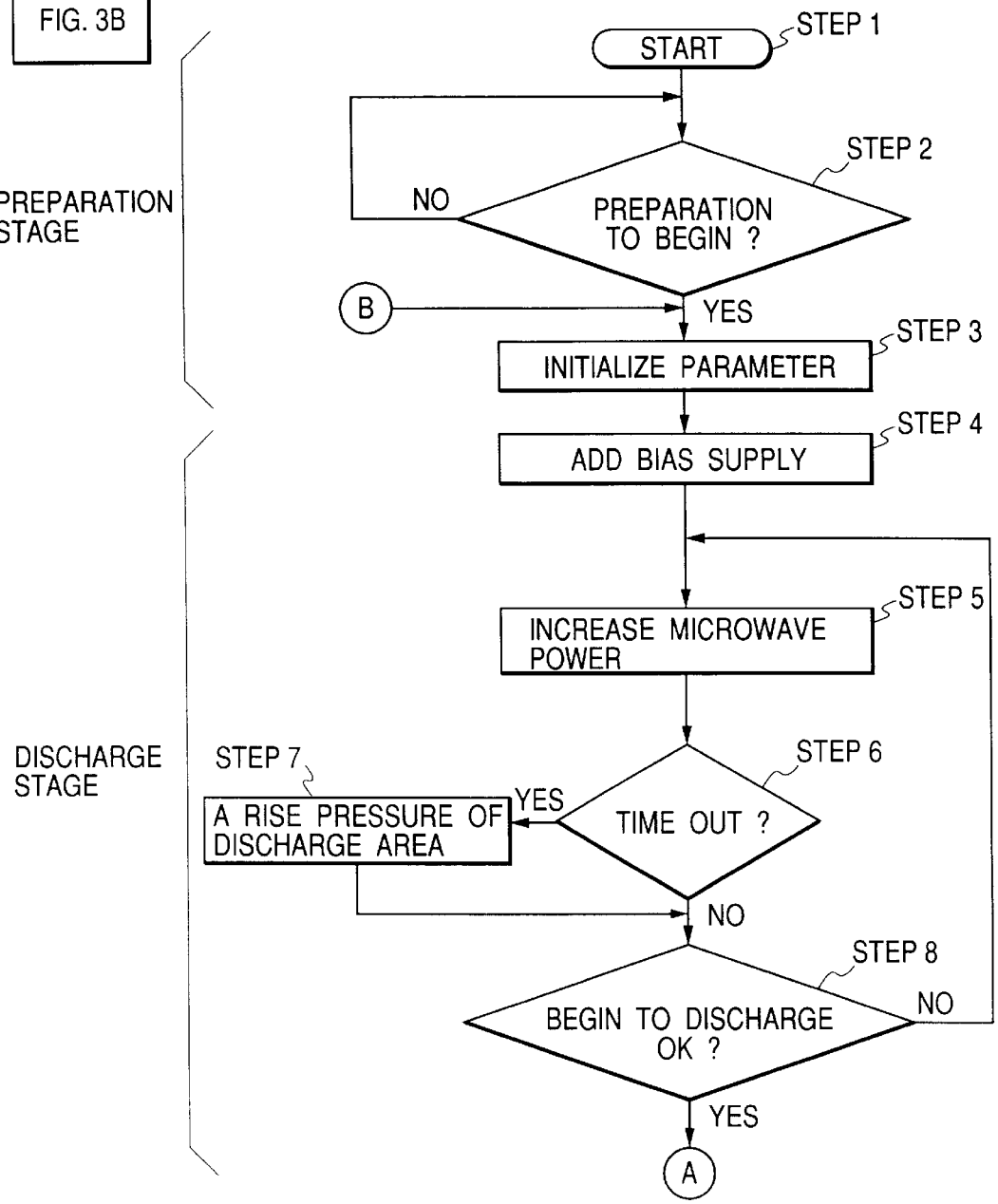

PLASMA PROCESSING METHOD AND APPARATUS

BACKGROUND OF THE INVENTION

1. Field of the Invention

The present invention relates to a plasma processing method of generating a plasma using two high-frequency powers having different frequencies. The present invention also relates to a method of automatically controlling the beginning of discharge by controlling the power application procedure in beginning discharge using a predetermined sequence. The present invention is effectively applied to mass production of photovoltaic devices based on a roll-to-roll scheme.

2. Related Background Art

As is conventionally known, plasma processing such as CVD, etching, or ashing is performed by supplying a microwave or VHF into a vacuum chamber and simultaneously applying an RF bias using an RF to a substrate or the space in the vacuum chamber to generate a plasma.

As such plasma processing, a deposition film forming method based on microwave plasma CVD using an RF bias is applied to manufacture a photovoltaic device. For example, Japanese Laid-Open Patent Application No. 6-51228 discloses, as a means for beginning microwave plasma discharge, a method of introducing a raw material gas into a discharge area while keeping a low pressure, and applying both a microwave power and an RF power to the discharge area to begin discharge. In this prior art, the RF power serves as a bias on the plasma obtained from the microwave to improve the quality of the deposition film. As compared to a DC bias, the RF bias is less likely to generate spark. Since a higher-frequency energy can be applied to the plasma, a high-quality deposition film can be obtained.

In recent years, VHF plasma CVD using a high frequency in the VHF band has also been examined. As is described in, e.g., Japanese Laid-Open Patent Application No. 7-245269, according to the VHF plasma CVD, a deposition film can be uniformly formed on a substrate having a relatively large area at a high process rate. In this frequency band, the raw material gas utilization efficiency is higher than that in RF plasma CVD, so the deposition film forming rate can be increased. Additionally, since VHF discharge widens the range of discharge conditions (pressure, power to be applied, raw material gas composition, and the like) as compared to microwave discharge, the degree of freedom in controlling the quality of the deposition film increases. VHF plasma CVD is suitable for deposition of an amorphous silicon film. Especially, in depositing a micro-crystallized silicon film, the VHF plasma CVD with the large degree of freedom for film forming conditions can be used to optimize the crystal particle diameter or crystal grain boundary structure, so a high-quality deposition film can be expected.

As a method of manufacturing a large-area device using microwave plasma CVD or RF plasma CVD, a photovoltaic device forming method and apparatus using a roll-to-roll scheme are disclosed in U.S. Pat. No. 4,400,409 or Japanese Laid-Open Patent Application No. 3-30419. In these apparatuses, a plurality of glow discharge areas are arranged. A sufficiently long band-shaped substrate having a desired width is continuously carried in the longitudinal direction of the band-shaped substrate along the route sequentially extending through the glow discharge areas, thereby continuously forming devices each having a semiconductor junction.

Japanese Laid-Open Patent Application No. 7-41954 discloses a method of automatically restoring plasma discharge upon detecting the stop of plasma discharge in a microwave plasma processing apparatus using no RF bias. In this method, the discharge stop state is detected by monitoring the pressure in the discharge space, the reflected wave power in discharge, the potential in the discharge space, or the current value in the discharge space. To restore discharge, a microwave power larger than the discharge keeping power is applied, or the pressure in the vacuum chamber is made lower than the discharge keeping pressure.

However, in automatically beginning/keeping plasma discharge, the following problems are posed.

(1) When plasma discharge is to be begun first using a first high-frequency power, the first high-frequency power stronger than in film formation must be applied to the discharge area while applying a second high-frequency power with an appropriate magnitude. If the order of power application or the timing of adjusting the impedance matching of the second high-frequency power is inappropriate, spark may be generated in the discharge area, or the impedance matching may shift to disappear discharge. This makes it difficult to smoothly begin discharge. In fact, the beginning of discharge depends on operator's experiences, and the procedure of beginning microwave plasma discharge with high reproducibility is indefinite. For this reason, an automatic apparatus can hardly be designed.

(2) If discharge disappears during film formation due to some reason after beginning plasma discharge using the first high-frequency power, discharge is sometimes difficult to begin again because of the reason of (1). Since the rebeginning of discharge takes time, defects occur in the deposition film, resulting in a decrease in yield.

(3) If a large deposition film is uniformly formed by applying the first and/or second high-frequency power from a plurality of application means to one discharge area, discharge by one of the application means may disappear.

if discharge partially disappears, the thickness of the deposition film becomes nonuniform or smaller than a desired thickness, resulting in a decrease in yield.

The present invention has another challenge. When a photovoltaic device is to be manufactured using the plasma CVD apparatus of the roll-to-roll scheme, the apparatus becomes bulky because a number of discharge areas are set in a line along the longitudinal direction. In addition, the raw material gas supply system, the exhaust system, and the power supply system tend to be complex. To improve the reproducibility of the device performance or operability of the apparatus, the operation of the apparatus is preferably automatized as far as possible. If devices are to be mass-produced to reduce the manufacturing cost, it is essential to automatically operate the entire apparatus to improve the operating efficiency or yield.

SUMMARY OF THE INVENTION

It is an object of the present invention to provide a plasma processing apparatus for automatically smoothly beginning plasma discharge using a first high-frequency power (e.g., a microwave or VHF) simultaneously using a second high-frequency power (e.g., an RF) as a bias. It is another object of the present invention to provide a plasma processing apparatus capable of automatically beginning discharge upon detecting that discharge disappears during processing. It is still another object of the present invention to occasionally adjust application of a first high-frequency power using an automatic apparatus while measuring the plasma strength during processing to maintain stable plasma processing.

According to an aspect of the present invention, there is provided a method of performing plasma processing using a first high-frequency power and a second high-frequency power with a frequency lower than that of the first high-frequency power, comprising the discharge beginning step of supplying the second high-frequency power smaller than a power in processing into a processing chamber through an impedance matching circuit and then supplying the first high-frequency power larger than a power in processing into the processing chamber to generate a plasma, the adjustment step of reducing a magnitude of the first high-frequency power to be close to the value in processing, increasing a magnitude of the second high-frequency power to be close to the value in processing, and then adjusting the magnitude of the first high-frequency power to obtain a plasma strength of a predetermined value, and the plasma processing step of causing the impedance matching circuit to perform a matching operation and simultaneously adjusting the value of the first high-frequency power to obtain a plasma strength of a desired value in processing, thereby performing plasma processing of a substrate to be processed.

According to another aspect of the present invention, there is provided a plasma processing apparatus having a plasma processing chamber, means for supplying a first high-frequency power into the plasma processing chamber, means for supplying a second high-frequency power having a frequency lower than that of the first high-frequency power into the plasma processing chamber, means for introducing a processing gas into the plasma processing chamber, means for reducing a pressure in the plasma processing chamber, measurement means for measuring a strength of a plasma generated in the plasma processing chamber, and a discharge control apparatus for controlling plasma discharge, wherein the discharge control apparatus comprises means for controlling the discharge beginning step of supplying the second high-frequency power smaller than a power in processing into the processing chamber through an impedance matching circuit and then supplying the first high-frequency power larger than a power in processing into the processing chamber to generate a plasma, the adjustment step of reducing a magnitude of the first high-frequency power to be close to the value in processing, increasing a magnitude of the second high-frequency power to be close to the value in processing, and then adjusting the magnitude of the first high-frequency power to obtain a plasma strength of a predetermined value, and the plasma processing step of causing the impedance matching circuit to perform a matching operation and simultaneously adjusting the value of the first high-frequency power to obtain a plasma strength of a desired value in processing, thereby performing plasma processing of a substrate to be processed.

When disappearance of plasma discharge is detected in the plasma processing step, preferably, the impedance matching circuit is set in an initial state, and the discharge beginning step is performed again. The apparatus preferably has detection and control means therefor.

BRIEF DESCRIPTION OF THE DRAWINGS

FIG. 3 which is comprised or FIGS. 3A and 3B are flow charts for explaining the operation of the plasma discharge control apparatus shown in FIG. 1;

DESCRIPTION OF THE PREFERRED EMBODIMENT

A preferred embodiment of the present invention will be described below with reference to the accompanying drawings.

In this embodiment, a microwave is used as a first high-frequency wave, and an RF is used as a second high-frequency wave. Even when a VHF is used as the first high-frequency wave, the same effect as in the above case can be obtained. In this specification, an RF means a high-frequency wave having a frequency from 1 MHz inclusive to 20 MHz exclusive. A VHF is a high-frequency wave having a frequency from 20 MHz inclusive to 1 GHz exclusive. A microwave means a high-frequency wave having a frequency from 1 GHz inclusive to 10 GHz exclusive.

Figure 1:
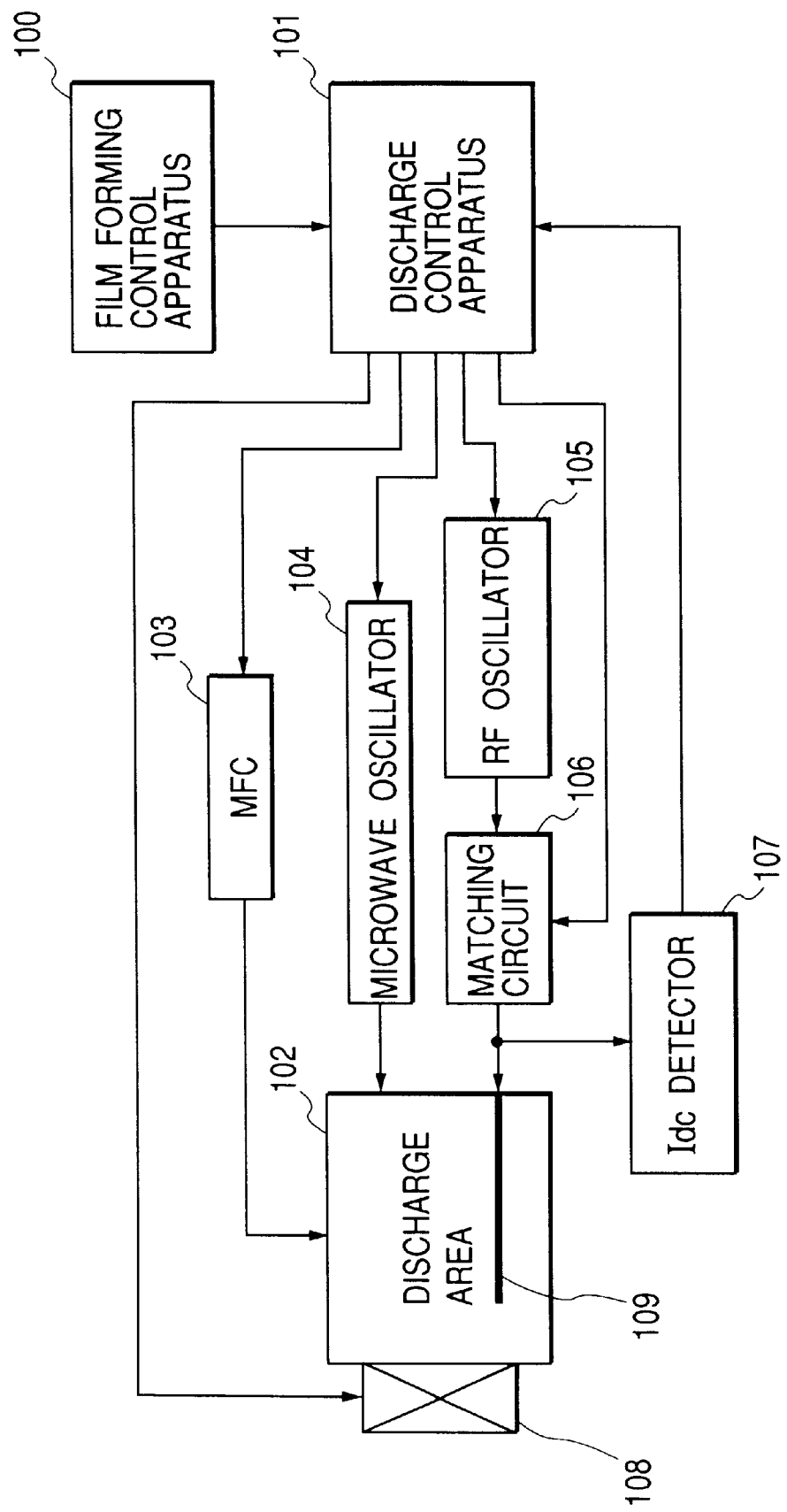
FIG. 1 is a block diagram showing the arrangement of a plasma discharge control apparatus for automatizing a film forming apparatus according to the present invention.

FIG. 1 is a block diagram showing the arrangement of a plasma discharge control apparatus for automatizing a film forming apparatus according to the present invention. A discharge control apparatus 101 has an input circuit, an output circuit, and a calculator (none are shown). The input circuit is connected to a detector 107 for detecting a current value Idc flowing upon grounding the DC component of a voltage applied to a bias bar 109, and a film forming control apparatus 100 for controlling the entire apparatus. The output circuit is connected to a microwave oscillator 104 as a means for generating the first high-frequency wave, an RF oscillator 105 as a means for generating the second high-frequency wave, a matching circuit 106, a mass flow controller (to be abbreviated as an MFC hereinafter) 103, and an exhaust adjust valve 108.

The discharge control apparatus 101 has a function of adjusting the microwave power and RF power applied to a discharge area 102, the gas flow rate, and the opening ratio of the exhaust valve, and a function of switching the fixing operation and automatic matching operation of the matching circuit. The bias bar 109 is connected to the output terminal of the matching circuit 106.

[Embodiment of Apparatus]

A specific example of the plasma processing apparatus for realizing the plasma processing method of the present invention will be described below with reference to FIG. 2.

A discharge area 203 formed from an almost parallelopiped film forming container 202 and a substrate 200 is arranged in a vacuum container 201. The substrate 200 may have a band shape. In this case, the substrate 200 is carried in a direction perpendicular to the sheet surface of FIG. 2. The vacuum container 201 and the film forming container 202 are electrically connected and set at the ground potential.

In this apparatus, a substrate heater 204 for heating the band-shaped substrate to a desired film forming temperature, a raw material gas installation pipe 205 for introducing a raw material gas supplied from a gas supply means (not shown) into the film forming chamber, an exhaust pipe 206 for exhausting the film forming chamber using an exhaust means such as a vacuum pump (not shown), an exhaust adjust valve 207 which can adjust exhaust conductance applicators 209 for supplying the microwave power from a microwave oscillator 208 into the film forming container, and a bias bar 212 for applying the RF bias power from an RF oscillator 210 to the plasma are arranged.

A matching circuit 211 is connected between the RF oscillator 210 and the bias bar 212. By changing two parameters for matching and tuning, the impedance matching between the RF oscillator and the bias bar can be adjusted. The matching circuit 211 also has a function of automatically adjusting the parameter by itself to perform the matching operation.

The film forming container 202 partially has mesh-like holes in its side surface. The plasma and electromagnetic wave can be confined in the film forming container 202, and the decomposed raw material gas can be removed.

An Idc detector 216 is connected between the matching circuit 211 and the bias bar 212. The Idc detector 216 is constituted by a choke coil 213 and a resistor 214. As described above, the current value of the DC component applied to the bias bar 212 is output to an Idc output 215 as an output voltage. The RF power is applied to the bias bar 212. Since the mass of electrons is much smaller than that of an ion species, a larger number of electrons reach the bias bar due to the force of the RF field. When the bias bar is in a DC-floating state, the bias bar is charged to a negative potential. When only the DC component is grounded through the choke coil 213, a current (Idc) flows to the choke coil 213. The current value Idc is almost proportional to the degree of ionization of the plasma, and the current value Idc can be regarded as a plasma strength. The current value Idc of the DC current flowing to the choke coil 213 is converted into a voltage using the resistor 214 and output to the Idc output 215, so the Idc detector measures the plasma strength. When the Idc detector is to be used as a discharge beginning detection means, a threshold value is set. When the current value Idc exceeds the threshold value, it is determined that discharge has begun. When the current value Idc is equal to or smaller than the threshold value, it is determined that discharge has disappeared or partially disappeared.

Figure 2:
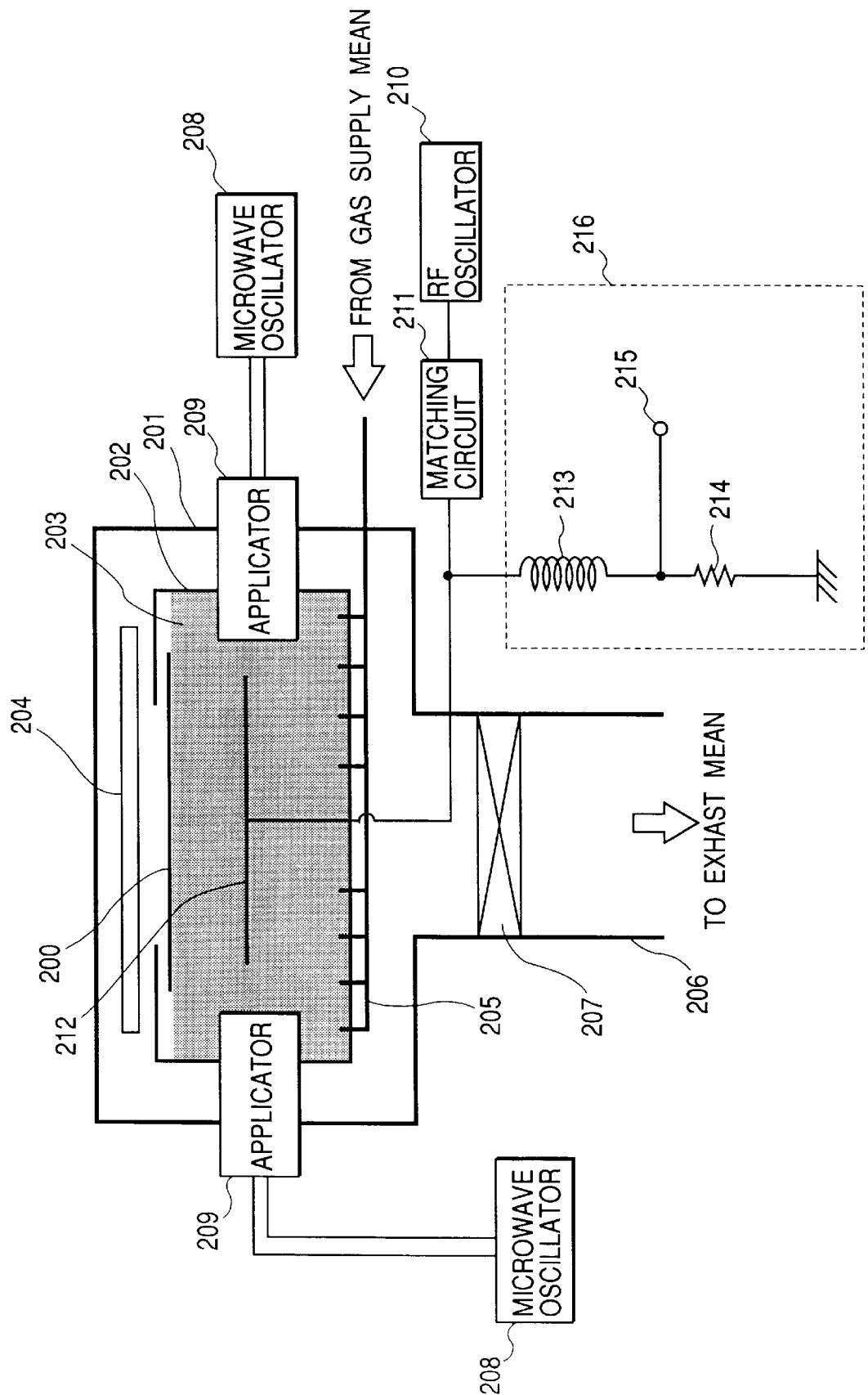
FIG. 2 is a schematic sectional view showing a plasma processing apparatus of the present invention.

The apparatus shown in FIG. 2 performs microwave power plasma discharge using two applicators 209. By applying the microwave power from a plurality of directions using the plurality of applicators, the film formation area can be increased while keeping uniform film characteristics of the substrate 200 (for a band-shaped substrate, the film characteristics in the direction of width). In use of the plurality of applicators, plasma discharged from not all but some applicators may disappear. At this time, the plasma strength degrades to lower the output from the Idc detector. When a threshold value is set for the current value Idc, it can be detected that the plasma has partially disappeared.

Figure 3B:
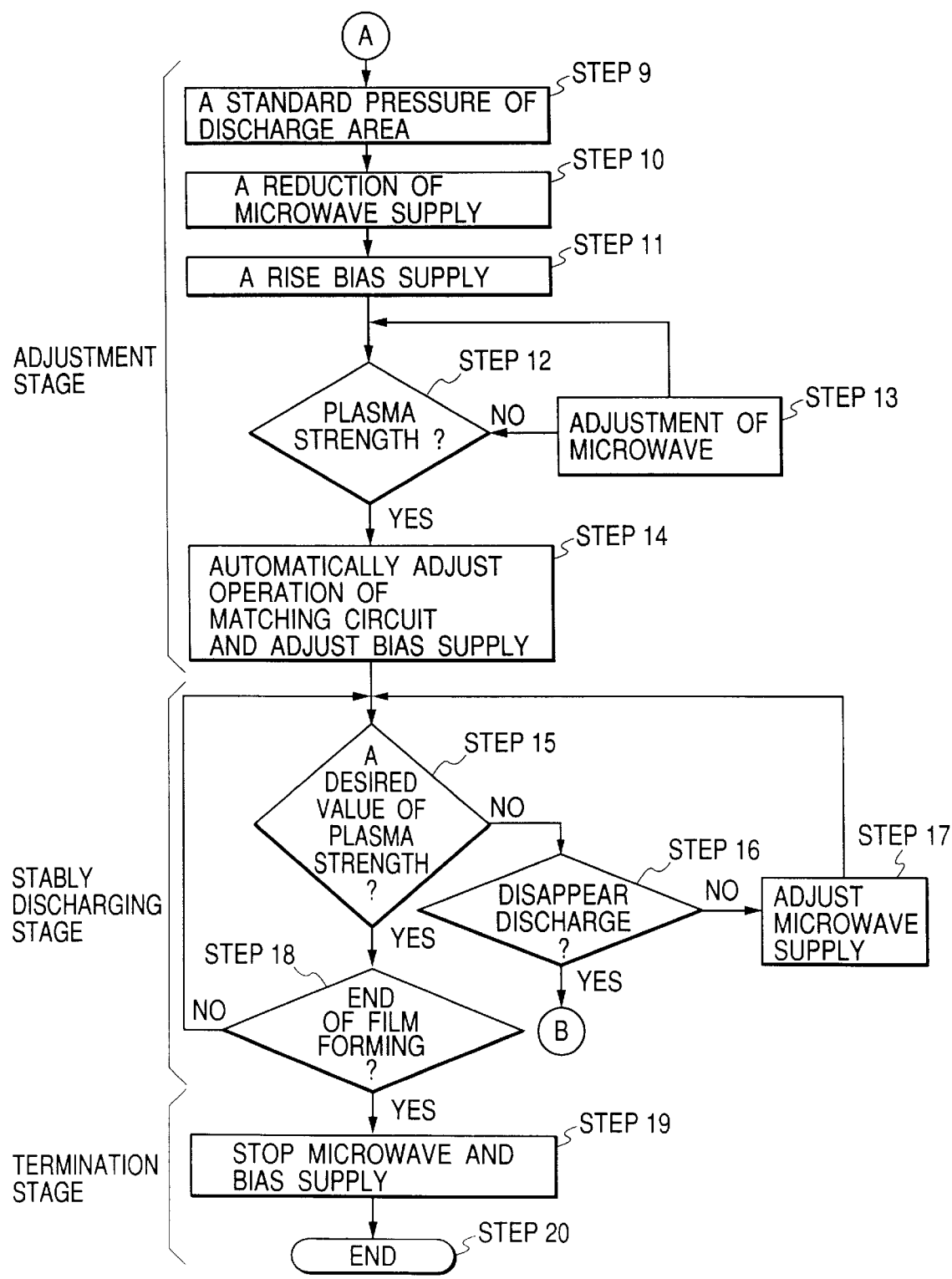

FIGS. 3A and 3B are flow charts showing the operation of the discharge control apparatus 101 shown in FIG. 1, and this will be described next with reference to FIG. 1.

(Preparation Stage)

In step 1, a start signal is sent from the film forming control apparatus 100 to the discharge control apparatus 101.

In step 2, processing waits until film forming parameters other than those controlled by the discharge control apparatus 101 are prepared. For example, processing waits until the temperature of the band-shaped substrate, the flow rate of the raw material gas, and the pressure in the discharge area reach defined values.

In step 3, matching and tuning parameters of the matching circuit 106 are initialized and fixed. The initial values are values determined upon final impedance matching in stable film formation and experimentally determined in advance. When the parameters of the matching circuit 106 are fixed at the initial stage of beginning discharge, discharge is prevented from disappearing due to a failure in automatic matching operation. In addition, when the parameters of the matching circuit 106 are initialized, the impedance almost matches immediately after discharge has begun. Due to the above reasons, it is possible to smoothly begin discharge with high reproducibility.

(Discharge Stage)

In step 4, a few RF power is added or applied from the RF oscillator 105 to the bias bar 109. The RF power at this time is called desired value 1. Under a film forming condition suitable for microwave discharge, discharge does not begin only with the RF power. For this reason, at this time point, most of the input RF power is reflected on the RF oscillator 105 side.

In step 5, a microwave power is applied into the film forming container 202. In step 8, when the measured current value Idc exceeds threshold value 1, it is recognized that discharge has begun. In step 5, the effective microwave power is gradually increased until discharge begins.

The procedure of beginning discharge will be described on the basis of FIG. 2. A raw material gas is introduced to the discharge area 203 through the raw material gas installation pipe 205. The opening ratio of the exhaust adjust valve 207 is controlled to keep the discharge area 203 at a predetermined pressure. First, an RF power is applied in a small amount to the bias bar 212. Preferably, power of 10% or less that in film forming is applied. Next, the microwave power is applied from the applicator 209. The same microwave power as that in film forming or a larger power is applied to generate a plasma. Whether the plasma has been generated can be confirmed by a plasma strength measurement means (to be described later). Immediately after plasma generation, a larger microwave power than in film forming is being applied. If the RF bias power is increased at this time point, spark is readily generated, and the plasma is likely to disappear. To prevent this, the RF bias power is not increased at this time point.

In step 6, when a predetermined time has elapsed after the applied microwave power has reached the maximum value, and discharge has not begun yet, it is determined that it is difficult to cause discharge under this film forming condition. In step 7, to facilitate discharge, the pressure in the discharge area 102 is raised. Two techniques are available to raise the pressure. As one technique, the MFC 103 is adjusted to increase the flow rate of the raw material gas to be introduced into the discharge area 102. When a plurality of raw material gases are used, any gas can be increased. Especially, the $H_2$ gas is preferably increased because even when the flow rate is increased, the amount of change in measured current value Idc is small. As the other technique, the opening ratio of the exhaust adjust valve 108 is decreased to increase the pressure in the discharge area 102.

(Adjustment Stage)

When discharge has begun, and it is detected that the measured current value Idc exceeds threshold value 1, the MFC 103 is adjusted in step 9 to adjust the gas flow rate, or the opening ratio of the exhaust adjust valve 108 is adjusted, thereby returning the pressure to the defined value.

In step 10, the effective microwave power is gradually reduced to desired value 2. Desired value 2 may be equal to power applied in film forming under stable discharge. However, this stage is a transient stage, and to prevent discharge from disappearing, the microwave power is preferably slightly larger than that in film forming. More specifically, it is preferable that the microwave power be 100% to 200% that in film forming, and more preferably, 120% to 180% that in film forming. This value is experimentally determined.

In step 11, the effective microwave power is gradually raised to desired value 3. Desired value 3 is preferably equal to power applied in film forming under stable discharge. However, to prevent abnormal discharge, this value may be slightly smaller. More specifically, the RF power is 70% to 100% that in film forming. After the microwave power is reduced, the RF bias power is raised. With this processing, stable discharge can be maintained while preventing spark.

In step 12, the plasma strength is controlled. In step 13, the effective microwave power is adjusted such that the power is close to the desired value in film forming or falls within the range of 100% to 150% of the desired value. Two methods are available to control the plasma strength. As the first method, the input microwave power is adjusted such that the measured current value Idc is close to desired value 3. As the second method, the input microwave power is adjusted such that the effective value of the microwave power=(input power−reflected power) is close to desired value 4. Using one of these methods, the microwave power is reduced.

At this time point, RF impedance matching has the tentative initial value, and the matching is not ideal but transient. For this reason, to prevent discharge from disappearing, the plasma strength is preferably adjusted to be slightly higher than the desired value in film forming, and specifically, 100% to 150% the desired value. As shown in FIG. 2, when microwave powers are applied from a plurality of applicators 209, the ratio of effective microwave powers to be applied from the applicators is appropriately adjusted to uniform the thickness and quality of the deposition film.

In step 14, the RF power is adjusted to the desired value in film forming. Simultaneously, the matching circuit 106 is shifted from the fixing operation to the automatic matching operation. The method of automatically matching the impedance between the RF oscillator and the load is generally used. As in the present invention, when the RF is applied into the microwave or VHF plasma as a bias power, the plasma is unstable from generation of the microwave or VHF plasma to stabilization of the plasma, so automatic matching of the RF becomes unstable. By starting the automatic matching operation when the plasma is stabilized, i.e., adjustment for obtaining the desired microwave power in film forming is complete, the matching circuit can always be stably operated.

(Stably Discharging Stage)

In step 15, the microwave power is adjusted to finally set the plasma strength at the desired value in film forming. The plasma strength control method is the same as in step 12. During film forming, the plasma strength is always measured such that the measured current value Idc reaches desired value 4, or the effective microwave power reaches desired value 5. In step 17, the input microwave power is adjusted.

In step 16, if the Idc detector recognizes that discharge has disappeared during film forming, the flow returns to step 3 to begin discharge again. Threshold value 2 is set, and when the measured current value Idc is smaller than threshold value 2, it is recognized that discharge has disappeared.

If the Idc detector 107 confirms that discharge has disappeared at the stably discharging stage, the flow returns to the discharge stage to cause discharge again. With this processing, continuous film forming can be performed without stopping the continuous film forming apparatus.

(Termination Stage)

In step 18, a film forming end instruction is received from the film forming control apparatus 100. In step 19, the discharge control apparatus 101 is terminated to stop the microwave power and RF bias power.

In step 20, a signal indicating the end of the operation of the discharge control apparatus 101 is returned to the film forming control apparatus 100.

(Application to Photovoltaic Device)

An example in which the method of the present invention is applied to a plasma CVD apparatus of a roll-to-roll scheme to manufacture a photovoltaic device having a pin junction will be described next with reference to FIG. 4.

Figure 4:
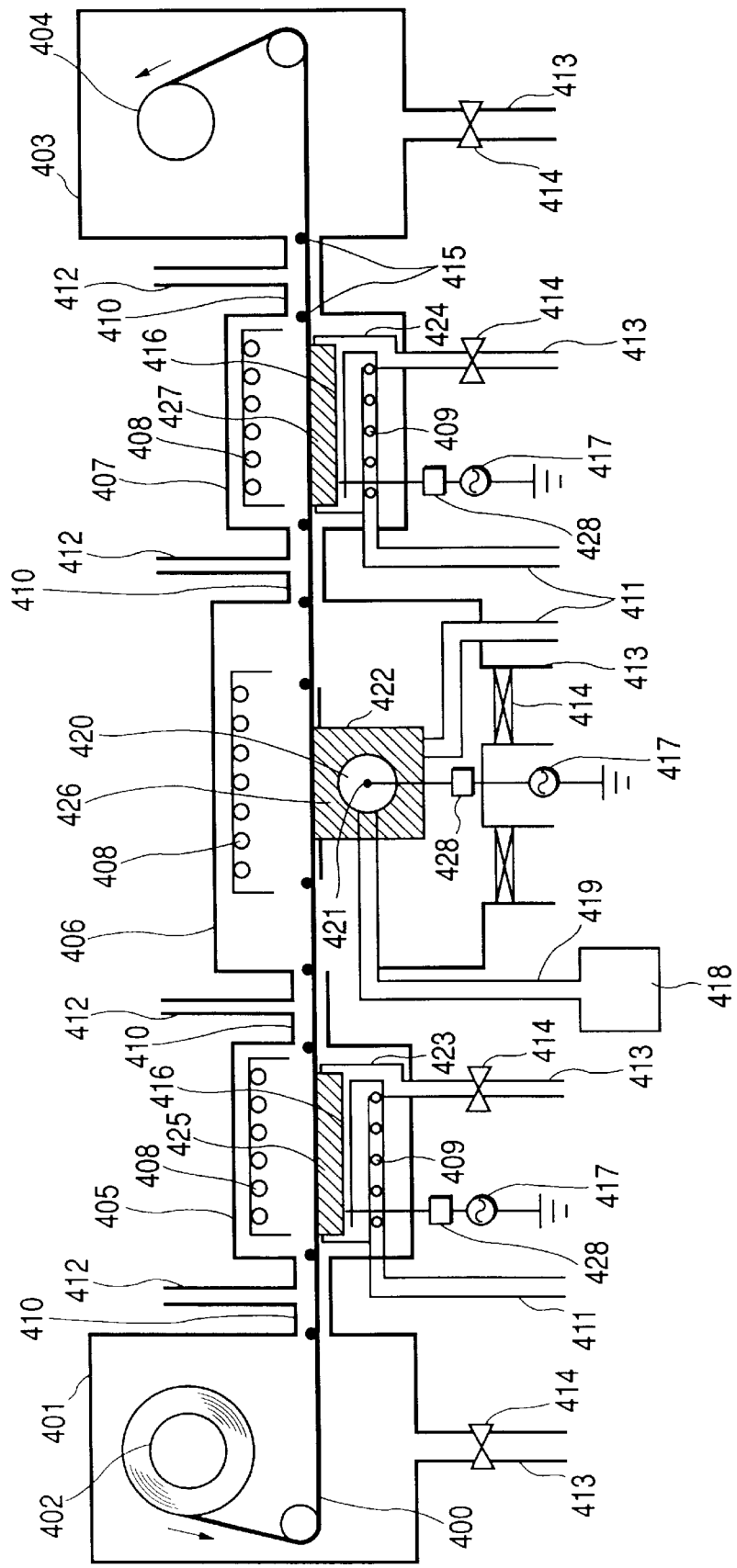
FIG. 4 is a schematic sectional view showing an example in which the plasma processing apparatus of the present invention is applied to a roll-to-roll scheme.

Referring to FIG. 4, the plasma CVD apparatus has a band-shaped substrate 400, a supply container 401, a supply bobbin 402, a take-up container 403, a take-up bobbin 404, a first doped layer forming container 405, an i-type layer forming container 406, a second doped layer forming container 407, a substrate heater 408, gas heaters 409, gas gates 410, raw material gas installation pipes 411, gate gas installation pipes 412, gas exhaust ports 413, exhaust adjust valves 414, carriage rollers 415, cathodes 416, RF oscillators 417, a microwave oscillator 418, a waveguide 419, microwave applicators 420, and a bias bar 421. The i-type layer forming container 406 incorporates a film forming container 422 in which a deposition film is formed by microwave plasma CVD. The doped layer forming containers 405 and 407 incorporate film forming containers 423 and 424 in which deposition films are formed by RF CVD, respectively. The containers 405 to 407 have discharge areas 425 to 427, respectively.

The containers 401, 403, and 405 to 407 are connected by the gas gates 410. The band-shaped substrate 400 is carried from the supply container 401 to the take-up container 403 while passing through the three deposition film forming containers 405 to 407. A three-layer functional deposition film, e.g., a semiconductor film for a photovoltaic device having a pin structure is formed on the band-shaped substrate 400.

Preferably, the band-shaped substrate 400 is free from deformation and distortion at the temperature necessary in forming a semiconductor film and has a desired strength and conductivity. The band-shaped substrate is preferably as thin as possible in consideration of the cost and storage space as far as it has a sufficient strength to keep its shape even under a tensile force during carrying. The width of the band-shaped substrate is not particularly limited. The width is determined on the basis of the size of the semiconductor film forming means or forming container. Although the length of the band-shaped substrate is not particularly limited, a length allowing to take up the substrate to a roll is preferable. Long band-shaped substrates may be connected by, e.g., welding to obtain a longer substrate.

In the forming containers 405 to 407, the band-shaped substrate 400 is heated to a predetermined film forming temperature by the substrate heaters 408. Raw material gases supplied from gas supply means (not shown) through the raw material gas installation pipes 411 are supplied to the discharge areas 425 to 427 and removed by exhaust means (not shown) from the gas exhaust ports 413. When the exhaust rates are adjusted by the exhaust adjust valves 414, desired pressures are maintained in the discharge areas 425 to 427, respectively.

In the discharge area 426 in the forming container 406 using microwave CVD, the applicators 420 for applying a microwave power to the raw material gas from the microwave oscillator 418 through the waveguide 419 and the bias bar 421 for applying the RF power to the plasma are provided. In the discharge area 426, a deposition film is formed using microwave CVD by decomposing the supplied raw material gas. Since two applicators 420 are used, the uniformity of the deposition film characteristics in the direction of width of the band-shaped substrate 400 is improved. For the descriptive convenience, the directions of two applicators 420 will be referred to as a front side and a rear side, respectively.

In each of the discharge areas 425 and 427 in the forming containers 405 and 407 using RF CVD, the cathode 416 for applying the RF power to the raw material gas is provided, and a deposition film is formed by RF CVD. The raw material gas introduced from the raw material gas installation pipe 411 is heated by the gas heater 409 to improve the deposition film characteristics. By heating the film forming containers 422 to 424 by the heaters 408 and 409, the film forming containers 422 to 424 can be baked before film forming to reduce the impurity gas.

The gas gates 410 are arranged to separate the containers 401, 403, and 405 to 407 from each other and continuously carry the band-shaped substrate 400 through the containers 401, 403, and 405 to 407. To form a multiple of high-quality thin films having different compositions, a gate gas is introduced from the gate gas installation pipes 412 to prevent the raw material gases in adjacent containers from mixing, so the atmospheres can be separated. As the gate gas, $H_2$, He, or Ar is used.

The raw material gas supply means (not shown), the exhaust means (not shown), the substrate heaters 408, the gas heaters 409, the RF oscillators 417, the microwave oscillator 418, and a motor (not shown) for carrying the band-shaped substrate in the above-described apparatus are controlled by a film forming control apparatus (not shown) such as a sequencer or computer to allow an automatic operation based on a program.

The steps in the automatic operation will be described with reference to FIG. 4. The supply bobbin 402 on which the band-shaped substrate 400 is wound is set in the supply container 401. The empty take-up bobbin 404 is set in the take-up container 403. Cleaning and maintenance of the film forming containers 422 to 424 are performed in the air. After this, the automatic process starts.

1) Exhaust Process

The pressure in all the forming containers 401, 403, and 405 to 407 is lowered to about 1 Torr by the exhaust means.

2) Heating Process

The film forming containers 422 to 424 are heated to predetermined temperatures by the substrate heaters 408 and the gas heaters 409. This heating process is performed for the purpose of baking for eliminating water and an impurity gas such as oxygen adsorbed in the walls of the film forming containers 422 to 424 and the forming containers 405 to 407.

3) Film Forming Process

The raw material gases and the gate gas are introduced from the raw material gas installation pipes 411 and the gate gas installation pipes 412. Plasma discharge is started in the film forming containers 422 to 424 while the band-shaped substrate 400 is carried at a predetermined speed, thereby continuously depositing films on the band-shaped substrate 400. In this process, in the forming container 406, the above-described microwave discharge control apparatus of the present invention is operated to automatically begin microwave plasma discharge. When the band-shaped substrate 400 is taken up to a predetermined position by the take-up bobbin 404, all plasma discharge is stopped. Carrying is also stopped.

4) Cooling Process

The film forming containers 422 to 424 are cooled to a temperature at which cleaning and maintenance can be performed. In film forming, an ignitable secondary reaction product is sometimes deposited in the film forming containers 422 to 424. To prevent ignition in opening the containers, the containers are cooled in advance.

5) Purging Process

Before the forming containers 401, 403, and 405 to 407 are opened to the air, the raw material gases in the containers are substituted with a nitrogen gas.

6) Venting Process

The nitrogen gas is introduced in the forming containers 401, 403, and 405 to 407 until the atmospheric pressure is obtained.

Upon completing the above automatic process, the band-shaped substrate 400 taken up by the take-up bobbin 404 is extracted. After this, a transparent electrode film is deposited on the band-shaped substrate 400 by a film deposition apparatus (not shown), thus completing a thin-film photovoltaic device.

The present invention can also be applied to plasma processing other than plasma CVD, e.g., plasma etching or the like.

EXAMPLE 1

Using the plasma CVD apparatus of the roll-to-roll scheme shown in FIG. 4, which has the automatic control apparatus shown in FIG. 1, a pin-type amorphous silicon photovoltaic device was formed on a band-shaped substrate by the automatic process following the procedure shown in FIGS. 3A and 3B under the following conditions. This will be described below with reference to FIGS. 3A, 3B and 4. In this example, a microwave power was used as the first high-frequency power, and an RF power was used as the second high-frequency power.

As the band-shaped substrate 400, an SUS 430 having a width of 350 mm, a length of 300 m, and a thickness of 0.2 mm was used, and the substrate was prepared by depositing an aluminum thin film (thickness: 0.1 $\mu$m) and a zinc oxide (ZnO) thin film (thickness: 1.0 $\mu$m) on the band-shaped substrate 400 as a back reflection layer using a sputtering film forming apparatus of a roll-to-roll scheme (not shown).

The band-shaped substrate 400 was set such that it was supplied from the supply container 401 and taken up in the take-up container 403 while passing through the three film forming containers 405 to 407.

The containers 401, 403, and 405 to 407 were exhausted to about 1 Torr by the exhaust means (not shown) through the exhaust adjust valves 414. While exhaust was continued, the He gas was flowed from the gas installation pipes 411 and 412 at 100 sccm each. The pressure was kept at 1.0 Torr by measuring the pressure in the containers 401, 403, and 405 to 407 by a pressure gauge (not shown) and controlling the exhaust adjust valve 414. In addition, the substrate heaters 408 and the gas heaters 409 were heated to 300° C. Baking was performed for 5 hrs while keeping this state, thereby eliminating the impurity gas.

Next, the He gas from the gas installation pipes 411 and 412 was stopped. Raw material gases having compositions shown in Table 1 were flowed from gas mixers (not shown) into the film forming containers 422 to 424 through the raw material gas installation pipes 411. The $H_2$ gas was flowed from the gate gas installation pipes 412 to the gas gates. The carriage rate of the band-shaped substrate 400 was 1,000 mm/min. As for the high-frequency power application means, in the film forming container 422 using microwave CVD, the microwave was applied to the film forming region through the waveguide 419 and the microwave applicators 420 from the microwave oscillator 418 having an oscillation frequency of 2.45 GHz. The bias power is applied to the bias bar 421 from the RF oscillator 417 having an oscillation frequency of 13.56 MHz through a matching circuit 428. As the bias bar 421, a columnar bar of SUS 340 having a diameter of 20 mm and a length of 30 cm was used. In the film forming containers 423 and 424 using RF CVD, the RF power was applied from the RF oscillator 417 to the cathode 416 through the matching circuit 428. Plasma discharge was begun in the discharge areas 425 to 427 to continuously form an n-type amorphous silicon film, an i-type amorphous silicon germanium film, and a p-type micro-crystallized silicon film on the band-shaped substrate 400. The film forming conditions for each film forming container in stable film forming are shown in Table 1.

In this example, plasma strength control during film forming in steps 15 to 17 in FIG. 3B was performed by adjusting the input microwave power such that the measured current value Idc (desired value 4) was kept at 3.5 A. The measured current value Idc (threshold value 2) at which plasma disappearance was detected was set at 3.0 A. The high-frequency bias power (desired value 1) applied before plasma generation was set at 50 W. The effective microwave power when the plasma was generated for the first time was about 800 W on both the front and rear sides. The measured current value Idc at this time was 2.0 A, so the measured current value Idc (threshold value 1) at which plasma generation was detected was set at 1.5 A.

The time-out time in difficult plasma generation in step 6 was set to be 5 sec. However, in this example, since the plasma was generated in 5 sec, step 7 was not executed. Desired value 2 was 300 W on both the front and rear sides, and desired value 3 was 800 W.

Film forming was continuously performed for about 5 hours as the film forming process. A semiconductor layer with a pin junction was formed on part 250 m long of the band-shaped substrate having a total length of 300 m. The part 250 m long where the semiconductor layer was obtained will be called an effective portion.

Figure 5:
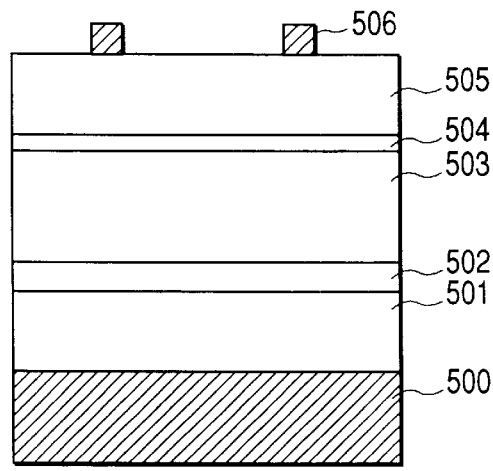
FIG. 5 is a schematic sectional view showing a photovoltaic device.

The band-shaped substrate on which the semiconductor layer was formed by the above procedure was extracted from the take-up container 403. An ITO (Indium Tin Oxide) transparent conductive film (thickness: 800 Å) was formed by a sputtering film forming apparatus (not shown). After this, the band-shaped substrate 400 was cut off into pieces 100 mm long by means of a cutter (not shown) while being fed out, thereby preparing samples. An Ag paste was screen-printed on each substrate to form a collecting electrode, thus completing a photovoltaic device shown in the schematic sectional view of FIG. 5. In FIG. 5, the device comprises a substrate 500, a back reflection layer 501, an n-type semiconductor layer 502, an i-type semiconductor layer 503, a p-type semiconductor layer 504, an ITO transparent conductive film 505, and a collecting electrode 506.

The characteristics of the resultant photovoltaic device were evaluated by measuring a photoelectric conversion efficiency η upon irradiating the substrate with a pseudosolar ray having an AM value of 1.5 and an energy density of 100 mW/cm$^2$. Table 2 shows the evaluation result. From the effective portion 250 m long of the band-shaped substrate, samples were extracted at an interval of 10 m and subjected to measurement. The difference between the maximum value and the minimum value of the characteristics of each of the 26 samples was evaluated as uniformity. The effective area of the samples was 350 mm×100 mm.

The ratio of part except defective deposition film portions due to plasma disappearance during film forming, i.e., the ratio of non-defective part was evaluated as a ratio of non-defective units. The number of times of plasma disappearance was also counted.

Comparative Example 1

In Comparative Example 1, film forming was performed following the same procedure as in Example 1 without using the discharge control apparatus 101 shown in FIG. 1. The same film forming conditions as in Table 1 were used. Comparative Example 1 is different from Example 1 in that the microwave oscillator, the RF oscillator, the MFC, and the exhaust adjust valve were manually controlled, and the matching circuit 106 was set to always perform the automatic matching operation. Evaluation was made on the basis of the same method as in Example 1.

TABLE 1

| Film forming container | Deposition film: thickness (nm) | Gas: flow rate (sccm) | Pressure (mTorr) | Effective power (W) | Heating temperature (° C.) | Deposition rate (nm/sec) |
|---|---|---|---|---|---|---|
| 423 | n-type layer: 20 nm | SiH$_4$: 100<br>H$_2$: 1000<br>PH$_3$/H$_2$ (2%): 150 | 1000 | RF: 200 | 270 | 1.2 |
| 422 | i-type layer: 150 nm | SiH$_4$: 100<br>GeH$_4$: 120<br>H$_2$: 500 | 10 | Microwave: (250 to 280) × 2<br>RF bias: 800 | 350 | 10 |
| 424 | p-type layer: 8 nm | SiH$_4$: 20<br>H$_2$: 3000<br>BF$_3$/H$_2$ (2%): 30 | 1000 | RF: 1000 | 300 | 0.2 |

TABLE 2

| | Uniformity | Ratio of non-defective units | Number of times of plasma disappearance |
|---|---|---|---|
| Example 1 | ±2% | 88% | 15 |
| Comparative Example 1 | ±5% | 68% | 16 |

The above experiment revealed the following facts.
1) In Comparative Example 1, when the plasma had disappeared during film forming, the discharge rebeginning operation was manually performed. In addition, the operation of the matching circuit 106 became unstable to take time for discharge rebeginning. This increased the defective portions, so the ratio of non-defective units lowered. The average time from beginning to stabilization of discharge was 180 sec.
In Example 1, discharge rebeginning was smoothly performed. The average time from beginning to stabilization was 40 sec, and the ratio of non-defective units increased.
2) In Comparative Example 1, the effective microwave power was adjusted while visually confirming the measured current value Idc during film forming. For this reason, accurate adjustment of the plasma strength was disabled, resulting in a decrease in uniformity. In Example 1, the measured current value Idc was fed back to the effective microwave power by the discharge control apparatus 101. Therefore, the accuracy of the plasma strength was improved, and the uniformity was increased.

EXAMPLE 2

In Example 2, to control the plasma strength during film forming in steps 15 to 17 in FIG. 3B, the input microwave power was adjusted to keep the effective microwave power (desired value 5) at 250 W. The apparatus arrangement was the same as in Example 1. The film forming conditions in stable film forming are shown in Table 3.

In Example 2, discharge did not begun in step 6 even when 5 sec elapsed after the microwave power reached the maximum output of the power supply. Discharge could be begun by increasing the $H_2$ gas to 1,500 sccm in step 7. The pressure in the discharge area at that time was 15 mTorr. After this, in step 9, the $H_2$ gas was reduced to the flow rate shown in Table 1. Evaluation was made using the same method as in Example 1.

Comparative Example 2

In Comparative Example 2, film forming was performed following the same procedure as in Example 2 without using the discharge control apparatus 101 shown in FIG. 1. The same film forming conditions as in Table 3 were used. Comparative Example 2 is different from Example 2 in that the microwave oscillator, the RF oscillator, the MFC, and the exhaust adjust valve were manually controlled, and the matching circuit 106 was set to always perform the automatic matching operation. Evaluation was made on the basis of the same method as in Example 1.

TABLE 3

| Film forming container | Deposition film: thickness (nm) | Gas: flow rate (sccm) | Pressure (mTorr) | Effective power (W) | Heating temperature (° C.) | Deposition rate (nm/sec) |
|---|---|---|---|---|---|---|
| 423 | n-type layer: 20 nm | $SiH_4$: 100 $H_2$: 1000 $PH_3/H_2$ (2%): 150 | 1000 | RF: 200 | 270 | 1.2 |
| 422 | i-type layer: 150 nm | $SiH_4$: 100 $GeH_4$: 120 $H_2$: 500 | 10 | Microwave (constant): 250 + 280 RF bias: 800 | 350 | 10 |
| 424 | p-type layer: 8 nm | $SiH_4$: 20 $H_2$: 3000 $BF_3/H_2$ (2%): 30 | 1000 | RF: 1000 | 300 | 0.2 |

TABLE 4

|  | Uniformity | Ratio of non-defective units | Number of times of plasma disappearance |
|---|---|---|---|
| Example 2 | ±2% | 86% | 15 |
| Comparative Example 2 | ±5% | 70% | 16 |

The above experiment revealed the following facts. The uniformity in Example 2 is higher than that in Comparative Example 2. Even when the plasma strength is adjusted while setting the effective microwave power at a constant value, stable characteristics can be obtained from the initial stage to the end of the film forming process. In addition, the average time from beginning to stabilization of discharge was 190 sec in Comparative Example 2 and 40 sec in Example 2.
Therefore, the defective portions decreased in Example 2, resulting in an improvement in ratio of non-defective units.

EXAMPLE 3

Figure 6:
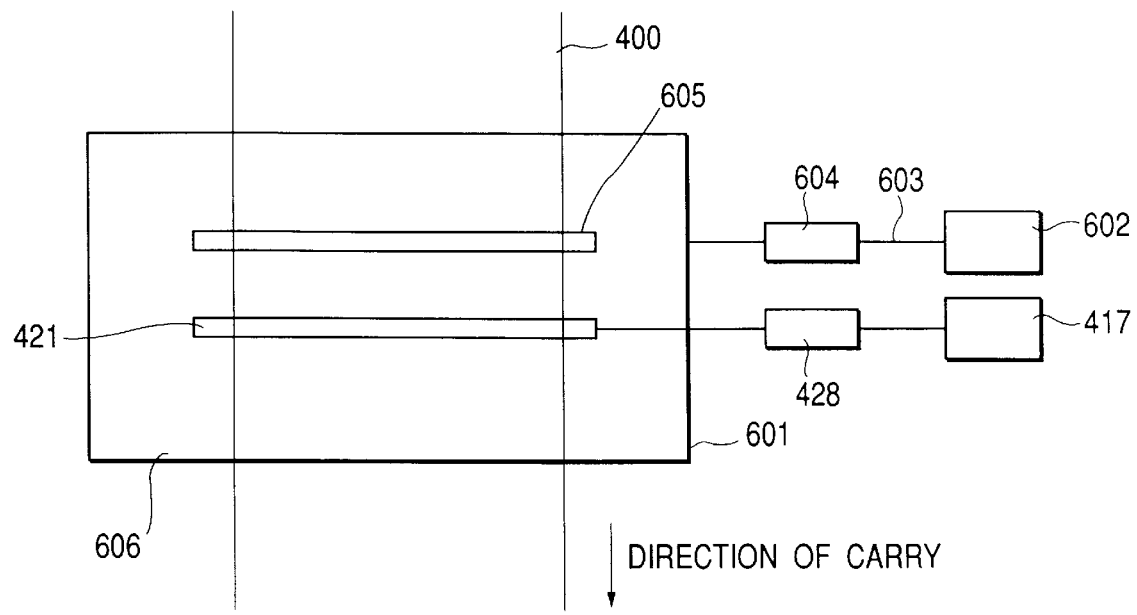
FIG. 6 is a schematic plan view for explaining an apparatus using a VHF.

In Example 3, a VHF was used as the first high-frequency wave for plasma processing. The difference from the apparatus shown in FIG. 4 will be described with reference to FIG. 6. The same reference numerals as in FIG. 4 denote the same parts in FIG. 6, and a detailed description thereof will be omitted. FIG. 6 is a schematic plan view for explaining a film forming container 601 used in place of the film forming container 422 in FIG. 4, and associated members. As shown in FIG. 6, a VHF oscillator 602 having an oscillation frequency of 100 MHz was used in place of the microwave oscillator 418. A coaxial cable 603 and a matching circuit 604 were used in place of the waveguide 419. In addition, a rod antenna 605 was used in place of the applicator 420. The rod antenna 605 had the same size and shape as those of the bias bar 421 and was set to be parallel to the bias bar 421 in a discharge area 606. The interval between the antenna and the bias bar 421 was 15 mm in the direction of carrying the band-shaped substrate. The remaining parts of the arrangement are the same as those in Example 1. The film forming conditions in stable film forming are shown in Table 5.

In Example 3, to control the plasma strength in steps 15 to 17 in FIG. 3, the input VHF power was adjusted to keep the measured current value Idc (desired value 4) at 3.0 A. Threshold value 1 was set at 1.0 A, threshold value 2 was set at 2.5 A, and desired value 1 of bias power was set at 50 W. Evaluation was made on the basis of the same method as in Example 1. Table 6 shows the evaluation result.

TABLE 5

| Film forming container | Deposition film: thickness (nm) | Gas: flow rate (sccm) | Pressure (mTorr) | Effective power (W) | Heating temperature (° C.) | Deposition rate (nm/sec) |
|---|---|---|---|---|---|---|
| 423 | n-type layer: 20 nm | $SiH_4$: 100 $H_2$: 1000 $PH_3/H_2$ (2%): 150 | 1000 | RF: 200 | 270 | 1.2 |
| 601 | i-type layer: 180 nm | $SiH_4$: 240 $GeH_4$: 200 $H_2$: 1000 | 15 | VHF: 1200 RF bias: 800 | 350 | 4.0 |
| 424 | p-type layer: 8 nm | $SiH_4$: 20 $H_2$: 3000 $BF_3/H_2$ (2%): 30 | 1000 | RF: 1000 | 300 | 0.2 |

Comparative Example 3

In Comparative Example 3, film forming was performed following the same procedure as in Example 3 without using the discharge control apparatus 101 shown in FIG. 1. The same film forming conditions as in Table 5 were used. Comparative Example 3 is different from Example 3 in that the VHF oscillator, the RF oscillator, the MFC, and the exhaust adjust valve were manually controlled, and the matching circuit 106 was set to always perform the automatic matching operation. Evaluation was made on the basis of the same method as in Example 1. Table 6 shows the evaluation result.

TABLE 6

|  | Uniformity | Ratio of non-defective units | Number of times of plasma disappearance |
|---|---|---|---|
| Example 3 | ±2% | 84% | 6 |
| Comparative Example 3 | ±4% | 64% | 8 |

The above experiment revealed the following facts.

1) In Comparative Example 3, when the plasma had disappeared during film forming, the discharge rebeginning operation was manually performed. In addition, the operation of the matching circuit 106 became unstable to take time for discharge rebeginning. This increased the defective portions, so the ratio of non-defective units lowered. The average time from beginning to stabilization of discharge was 200 sec. In Example 3, discharge rebeginning was smoothly performed. The average time from beginning to stabilization was 30 sec, and the ratio of non-defective units increased.

2) In Comparative Example 3, the effective VHF power was adjusted while visually confirming the measured current value Idc during film forming. For this reason, accurate adjustment of the plasma strength was disabled, resulting in a decrease in uniformity. In Example 3, the measured current value Idc was fed back to the effective VHF power by the discharge control apparatus. Therefore, the accuracy of the plasma strength was improved, and the uniformity was increased.

According to the present invention, plasma discharge can be automatically smoothly begun with high reproducibility using the automatic apparatus. Even when discharge has disappeared, it can be quickly rebegun. Application of this method to an apparatus for forming a photovoltaic device on a band-shaped substrate allows the full-automatic operation, resulting in an increase in productivity of photovoltaic devices and cost reduction. In addition, stable photovoltaic characteristics can be obtained across the band-shaped substrate. Since the defective portions can be minimized, the yield increases.

What is claimed is:

1. A method of performing plasma processing of a substrate using a first high-frequency power and a second high-frequency power with a frequency lower than that of the first high-frequency power, comprising:

a discharge beginning step of supplying the second high-frequency power, which is smaller than a power used in processing, into a processing chamber through an impedance matching circuit and then supplying the first high-frequency power, which is larger than a power used in processing, into said processing chamber to generate a plasma;

an adjustment step of reducing a magnitude of the first high-frequency power to be close to a value used in processing, increasing a magnitude of the second high-frequency power to be close to a value used in processing, and then adjusting the magnitude of the first high-frequency power to obtain a plasma strength of a predetermined value; and a plasma processing step of causing said impedance matching circuit to perform a matching operation and simultaneously adjusting a value of the first high-frequency power to obtain a plasma strength of a desired value in processing.

2. A method according to claim 1, further comprising in the plasma processing step, setting said impedance matching circuit in an initial state, and returning to the discharge beginning step again when disappearance of plasma discharge is detected.

3. A method according to claim 1, wherein the adjustment step comprises reducing the first high-frequency power to be 100% to 200% of the value in processing, and increasing the second high-frequency power to be 70% to 100% of the value in processing.

4. A method according to claim 1, wherein the adjustment step comprises setting the predetermined value of the plasma strength as 100% to 150% of the desired value of the plasma strength in processing.

5. A method according to claim 1, further comprising measuring the plasma strength by detecting a DC component of a current flowing between a ground potential and means for applying the second high-frequency power.

6. A method according to claim 1, further comprising measuring the plasma strength by detecting a difference between an input power and a reflected power of the first high-frequency power.

7. A method according to claim 1, wherein the discharge beginning step comprises increasing a processing gas introduction amount to raise a pressure in said processing chamber and then generating the plasma.

8. A method according to claim 1, wherein the discharge beginning step comprises reducing an opening ratio of an exhaust adjust valve to raise a pressure in said processing chamber and then generating the plasma.

9. A method according to claim 1, wherein an initial state of said impedance matching circuit is the same as a state of matching circuit in which a reflected power of the second high-frequency power takes a minimum value in the plasma processing step.

10. A method according to claim 1, wherein the discharge beginning step, the adjustment step, and the plasma processing step are automatically performed in an order named.

11. A method according to claim 1, wherein the magnitude of the second high-frequency power supplied in the discharge beginning step is not more than 10% of the magnitude of the second high-frequency power supplied in the plasma processing step.

12. A method according to claim 1, wherein the first high-frequency power is high-frequency power having one of a microwave frequency and a VHF frequency.

13. A method according to claim 1, wherein the second high-frequency power is high-frequency power having an RF frequency.

14. A plasma processing apparatus for processing a substrate having a plasma processing chamber, means for supplying a first high-frequency power into said plasma processing chamber, means for supplying a second high-frequency power having a frequency lower than that of the first high-frequency power into said plasma processing chamber, means for introducing a processing gas into said plasma processing chamber, means for reducing a pressure in said plasma processing chamber, measurement means for measuring a strength of a plasma generated in said plasma processing chamber, and a discharge control apparatus for controlling plasma discharge, wherein said discharge control apparatus comprises means for controlling a discharge beginning step of supplying the second high-frequency power, which is smaller than a power used in processing, into said processing chamber through an impedance matching circuit and then supplying the first high-frequency power, which is larger than a power used in processing, into said processing chamber to generate a plasma;

an adjustment step of reducing a magnitude of the first high-frequency power to be close to a value used in processing, increasing a magnitude of the second high-frequency power to be close to a value used in processing, and then adjusting the magnitude of the first high-frequency power to obtain a plasma strength of a predetermined value; and a plasma processing step of causing said impedance matching circuit to perform a matching operation and simultaneously adjusting a value of the first high-frequency power to obtain a plasma strength of a desired value in processing.

15. An apparatus according to claim 14, further comprising detection means for detecting disappearance of plasma discharge in the plasma processing step, and means for, when said detection means detects disappearance of plasma discharge in the plasma processing step, setting said impedance matching circuit in an initial state and controlling to return to the discharge beginning step again.

16. An apparatus according to claim 14, wherein the adjustment step comprises means for controlling the first high-frequency power to be 100% to 200% of the value in processing when reducing a magnitude of the first high-frequency power to be close to the value in processing, and means for controlling the second high-frequency power to be 70% to 100% of the value in processing when increasing a magnitude of the second high-frequency power to be close to the value in processing.

17. An apparatus according to claim 14, wherein the adjustment step comprises means for controlling the predetermined value of the plasma strength to be 100% to 150% of the desired value of the plasma strength in processing.

18. An apparatus according to claim 14, further comprising means for detecting a DC component of a current flowing between a ground potential and means for applying the second high-frequency power to measure the plasma strength.

19. An apparatus according to claim 14, further comprising means for detecting a difference between an input power and a reflected power of the first high-frequency power to measure the plasma strength.

20. An apparatus according to claim 14, further comprising means for increasing a processing gas introduction amount to raise a pressure in said processing chamber and then generating the plasma in the discharge beginning step.

21. An apparatus according to claim 14, further comprising means for reducing an opening ratio of an exhaust adjust valve to raise a pressure in said processing chamber and then generating the plasma in the discharge beginning step.

22. An apparatus according to claim 14, wherein when said impedance matching circuit is an initial state, the state is set to the state in which a reflected power of the second high-frequency power takes a minimum value in the plasma processing step.

23. An apparatus according to claim 14, wherein said discharge control apparatus controls automatically perform the discharge beginning step, the adjustment step, and the plasma processing step in an order named.

24. An apparatus according to claim 14, further comprising means for controlling the magnitude of the second high-frequency power supplied in the discharge beginning step to be not more than 10% of the magnitude of the second high-frequency power supplied in the plasma processing step.

25. An apparatus according to claim 14, wherein said means for supplying the first high-frequency power comprises means for supplying high-frequency power having one of a microwave frequency and a VHF frequency.

26. An apparatus according to claim 14, wherein said means for supplying the second high-frequency power comprises means for supplying high-frequency power having an RF frequency.

27. An apparatus according to claim 14, wherein said means for supplying the first high-frequency power has a plurality of applicators.

28. An apparatus according to claim 14, wherein said means for supplying the first high-frequency power has an antenna.

29. A plasma processing apparatus comprising a plurality of plasma processing apparatuses coupled to each other and including at least one plasma processing apparatus of claim 14, wherein a band-shaped substrate to be processed extends through said plurality of plasma processing apparatuses.

* * * * *

UNITED STATES PATENT AND TRADEMARK OFFICE
CERTIFICATE OF CORRECTION

PATENT NO.    : 6,031,198
DATED         : February 29, 2000
INVENTOR(S)   : Koichiro Moriyama et al.

It is certified that error appears in the above-identified patent and that said Letters Patent is hereby corrected as shown below:

Title page,
Item [56] References Cited, under U.S. PATENT DOCUMENTS,
Insert: -- 4,400,409 8/1983 Izu et al. --;

Under FOREIGN PATENT DOCUMENTS,
Insert: -- 3-30419A    2/1991  Japan --;
       -- 6-51228A    2/1994  Japan --;
       -- 7-245269A   9/1995  Japan --;
       -- 7-41954A    2/1995  Japan --.

Column 1,
Line 32, "spark." should read -- sparks. --;
Line 37, "according to the" should read -- using --.

Column 2,
Line 12, "to be" should be deleted; and "first" should be deleted;
Line 19, "spark" should read -- sparks --;
Line 20, "disappear" should read -- eliminate --;
Line 22, "the beginning of discharge depends on" should read -- commencing discharge depends on an operator's level of --;
Line 23, "operator's experiences," should read -- experience, --;
Line 24, "with" should read -- does not have --; and "is" should be deleted;
Line 25, "indefinite." should be delete;
Line 26, "hardly" should read -- not --;
Line 30, "the" (both occurrences) should be deleted and "of" (second occurrence) should be deleted;
Line 31, "rebeginning of" should read -- re-starting --;
Line 37, "if" should read -- If --;
Line 49, "automatized" should read -- automated --;
Line 62, "disappears" should read -- has stopped --.

Column 4,
Line 25, "automatizing" should read -- automating --.

Column 6,
Line 9, "a few" should be deleted;
Line 36, "spark" should read -- a spark --;

Line 41, "determined that it is" should be deleted.

UNITED STATES PATENT AND TRADEMARK OFFICE
CERTIFICATE OF CORRECTION

PATENT NO. : 6,031,198
DATED : February 29, 2000
INVENTOR(S) : Koichiro Moriyama et al.

It is certified that error appears in the above-identified patent and that said Letters Patent is hereby corrected as shown below:

<u>Column 7,</u>
Line 9, "spark." should read -- sparks. --;
Line 27, "150%" should read -- 150% of --.

<u>Column 13,</u>
Line 5, "begun" should read -- begin --;
Line 7, "be" should be deleted;
Line 8, "begun" should read -- begin --;
Line 66, "a" should be deleted.

<u>Column 15,</u>
Line 21, "be automatically smoothly begun" should read -- automatically, smoothly begin --;
Line 23, "be quickly rebegun" should read -- quickly re-started --.

Signed and Sealed this

Thirtieth Day of October, 2001

*Attest:*

NICHOLAS P. GODICI
*Attesting Officer*    *Acting Director of the United States Patent and Trademark Office*